United States Patent
Fu

(10) Patent No.: US 10,905,024 B1
(45) Date of Patent: Jan. 26, 2021

(54) EXPANSION CARD HOLDING MECHANISM WITH A FLOW-GUIDING THROUGH HOLE ALIGNED WITH A VENT OF A FLOW GUIDING STRUCTURE IN A DEVICE CASING

(71) Applicants: Inventec (Pudong) Technology Corp., Shanghai (CN); Inventec Corporation, Taipei (TW)

(72) Inventor: Yung-Teng Fu, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 16/706,848

(22) Filed: Dec. 9, 2019

(30) Foreign Application Priority Data

Sep. 6, 2019 (CN) .......................... 2019 1 0841574

(51) Int. Cl.
*H05K 7/14* (2006.01)
*H05K 5/02* (2006.01)

(52) U.S. Cl.
CPC ......... *H05K 7/1418* (2013.01); *H05K 5/0213* (2013.01); *H05K 5/0286* (2013.01); *H05K 7/1427* (2013.01)

(58) Field of Classification Search
CPC .. H05K 7/1418; H05K 5/0286; H05K 7/1427; H05K 5/0213; H05K 7/20145; G06F 1/20
See application file for complete search history.

(56) References Cited

U.S. PATENT DOCUMENTS

2011/0103010 A1* 5/2011 Zhang ....................... G06F 1/20
361/679.49

FOREIGN PATENT DOCUMENTS

CN 105468560 A * 4/2016

* cited by examiner

*Primary Examiner* — James Wu
(74) *Attorney, Agent, or Firm* — Winston Hsu

(57) ABSTRACT

An expansion card holding mechanism is disposed on a flow guiding structure in a device casing. The expansion card holding mechanism includes a sliding slot structure and a sliding part. The sliding slot structure is disposed on the flow guiding structure and includes two opposite side walls. The sliding part includes a sliding body and a positioning portion. The sliding body is slidably disposed along a direction between the two side walls. The positioning portion protrudes from the sliding body and is slidably engaged with one of the two slide walls. The sliding body has a flow-guiding through hole and an expansion card holding slot. The flow-guiding through hole is aligned with a vent of the flow guiding structure in the direction, so that air flow can pass through the flow guiding structure and the sliding part for dissipating heat from an expansion card.

13 Claims, 10 Drawing Sheets

EXPANSION CARD HOLDING MECHANISM WITH A FLOW-GUIDING THROUGH HOLE ALIGNED WITH A VENT OF A FLOW GUIDING STRUCTURE IN A DEVICE CASING

BACKGROUND OF THE INVENTION

1. Field of the Invention

The present invention relates to an expansion card holding mechanism, and more particularly to an expansion card holding mechanism applicable to be used in electronic equipment.

2. Description of the Prior Art

The development of the computer information industry has brought a wide range of applications for computers. At present, in order to provide more functions, external hardware with different specific functions is generally added inside the computer, e.g. expansion cards. General computer systems usually have expansion cards with different functions installed, e.g. graphics acceleration display cards, video cards, network cards, sound cards, graphics cards, disk array controller card and so on; a plurality of expansion slots are provided on the motherboard of the computer system. In the prior art, after the expansion card is installed into the expansion slot on the mainboard, the head portion of the expansion card (i.e. the portion of the expansion card that is exposed out of the computer casing; or a side portion of the expansion card on which a connection port is provided) is locked on a rear plate of the computer casing so as to fix the expansion card.

However, for special computer systems such as industrial computers or servers, some long expansion cards may be installed therein. If the long expansion card is fixed only through its head portion, the other end portion of the long expansion card is usually hanging. Under this structure configuration, when the server is in operation, the heat-dissipation fan of the computer system vibrates when in use. The length of the expansion card is so long that the end portion of the expansion card will produce cantilever beam effect. After a long period of operation, the expansion card may be damaged easily.

A current solution is to move a cover fastener of an air-guiding plate from top to bottom to hold the tail end of the expansion card for fastening the tail end of the expansion card. However, the solution is only applied to one expansion card. If there is another expansion card located above the original expansion card, the fastening way will not be practicable herein. That is, the fastening mechanism cannot allow the installation of the second expansion.

SUMMARY OF THE INVENTION

An objective of the invention is to provide an expansion card holding mechanism, which is disposed on a flow guiding structure in a device casing. The expansion card holding mechanism uses a sliding part with an expansion card holding slot for holding an expansion card and avoiding blocking heat-dissipation air flow.

An expansion card holding mechanism according to the invention is disposed on a flow guiding structure in a device casing. The flow guiding structure has a vent. The expansion card holding mechanism includes a sliding slot structure and a sliding part. The sliding slot structure is disposed on the flow guiding structure and includes two opposite side walls. The sliding part includes a sliding body and a positioning portion. The sliding body is slidably disposed along a direction between the two side walls. The positioning portion protrudes from the sliding body and is slidably engaged with one of the two slide walls. The sliding body has a flow-guiding through hole and an expansion card holding slot. The flow-guiding through hole is aligned with the vent in the direction. The expansion card holding slot can hold the board body of an expansion card installed in the device casing. Thereby, when an expansion card is installed in the device casing, the sliding part can be slid relative to the sliding slot structure to a supporting position, so that the board body of the expansion card fits in the expansion card holding slot. The flow-guiding through hole can guide air flow to pass through the flow guiding structure and the sliding part to dissipate heat generated by the expansion card. Furthermore, then the sliding part can be slid relative to the sliding slot structure to a disengaging position, so that the board body of the expansion card departs from the expansion card holding slot and a user can detach the expansion card.

Compared with the prior art, the expansion card holding mechanism according to the invention requires less operation space than the rotating operation in the prior art, and can hold (or support, fix) a plurality expansion card. Furthermore, the sliding operation of the sliding part of the expansion card holding mechanism according to the invention is parallel to the direction of the air flow guided by the flow guiding structure. In coordination with the flow-guiding through hole, the sliding part can avoid or reduce the influence on the heat dissipation of the air flow to the expansion card.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
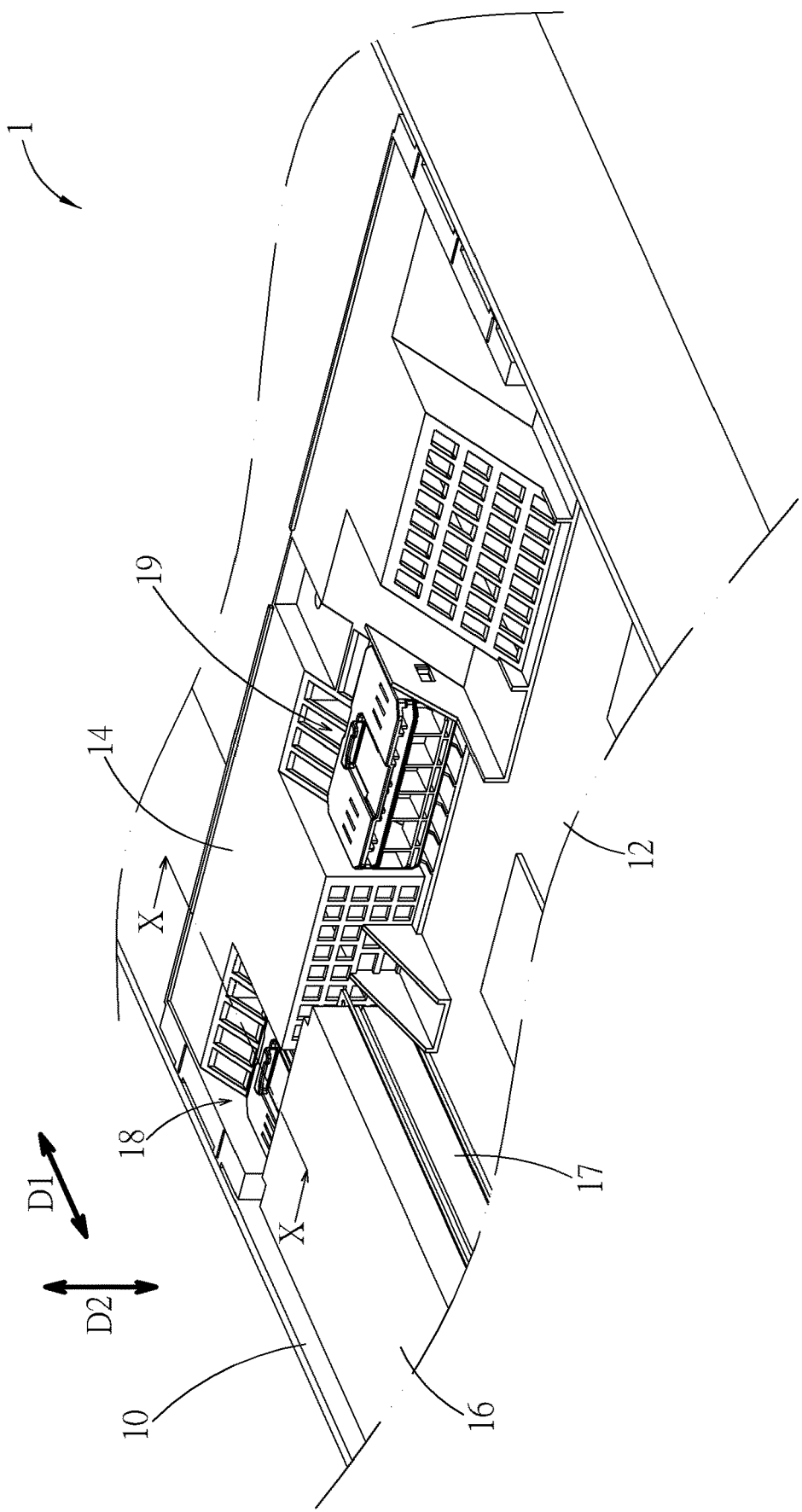
FIG. 1 is a schematic diagram illustrating part of the interior of an electronic equipment according to an embodiment.
Figure 2:
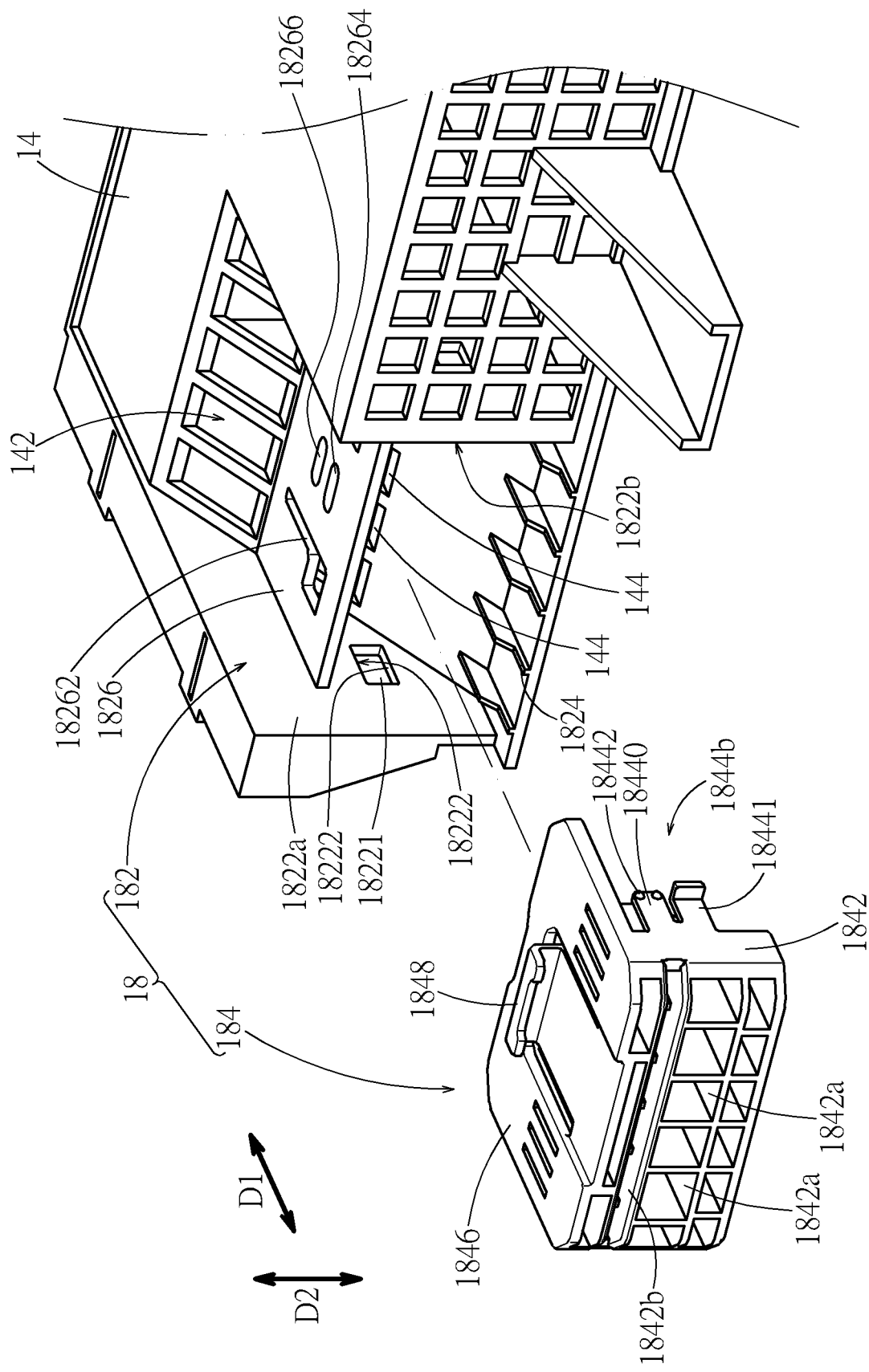
FIG. 2 is an exploded view of an expansion card holding mechanism in FIG. 1.
Figure 3:
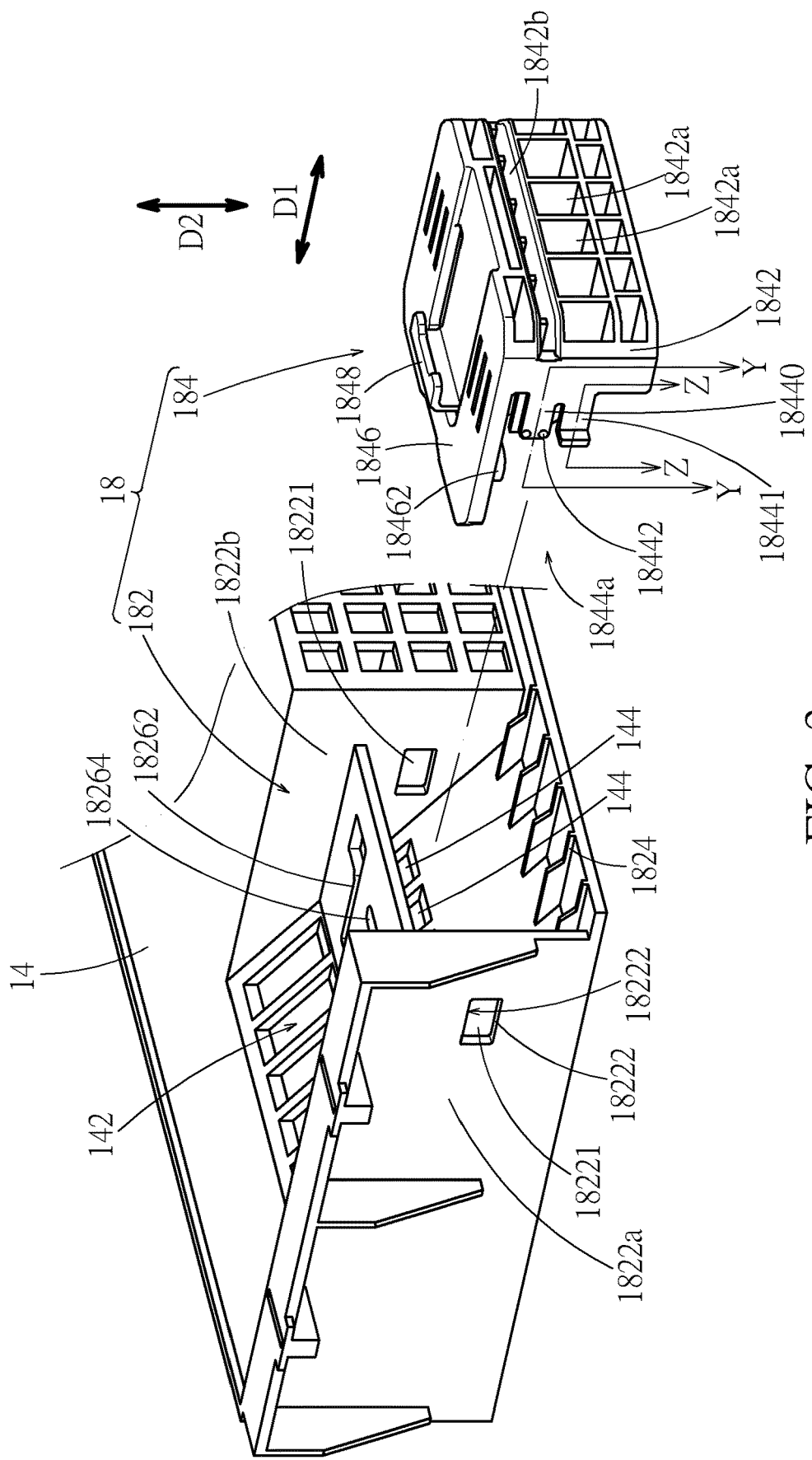
FIG. 3 is another exploded view of the expansion card holding mechanism in FIG. 2 in another view point.
Figure 4:
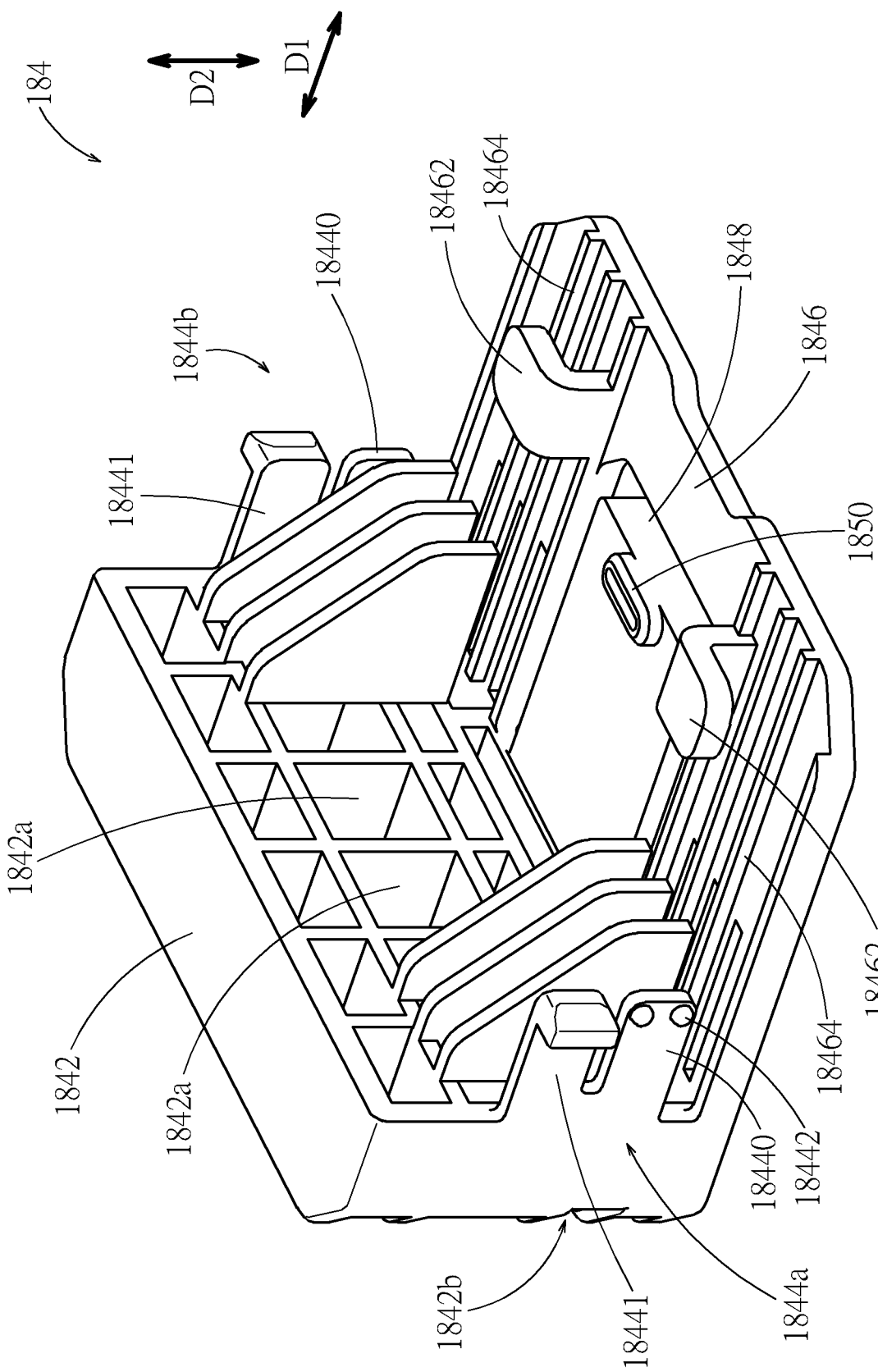
FIG. 4 is a schematic diagram illustrating a sliding part in FIG. 2 in another view point.

Please refer to FIG. 1. An electronic equipment 1 according to an embodiment (for example but not limited to a server) includes a device casing 10, a system main board 12, a flow guiding structure 14, an expansion card 16, and an expansion card holding mechanism 18; the system main board 12, the flow guiding structure 14, the expansion card 16, and the expansion card holding mechanism 18 are disposed in the device casing 10. The expansion card 16 is electrically connected to the system main board 12, for example by directly inserting into an expansion card slot on the system main board 12, or indirectly through an adapter card (e.g. a riser card). The expansion card holding mechanism 18 is operable to hold a side edge of the expansion card 16 for assisting in fixing the expansion card 16. The expansion card holding mechanism 18 is also operable to disengaged from the expansion card 16 for the convenience of uninstalling, installing the expansion card 16. The flow guiding structure 14 can guide air flow to pass through the expansion card holding mechanism 18 to dissipate heat generated by the expansion card 16.

Figure 5:
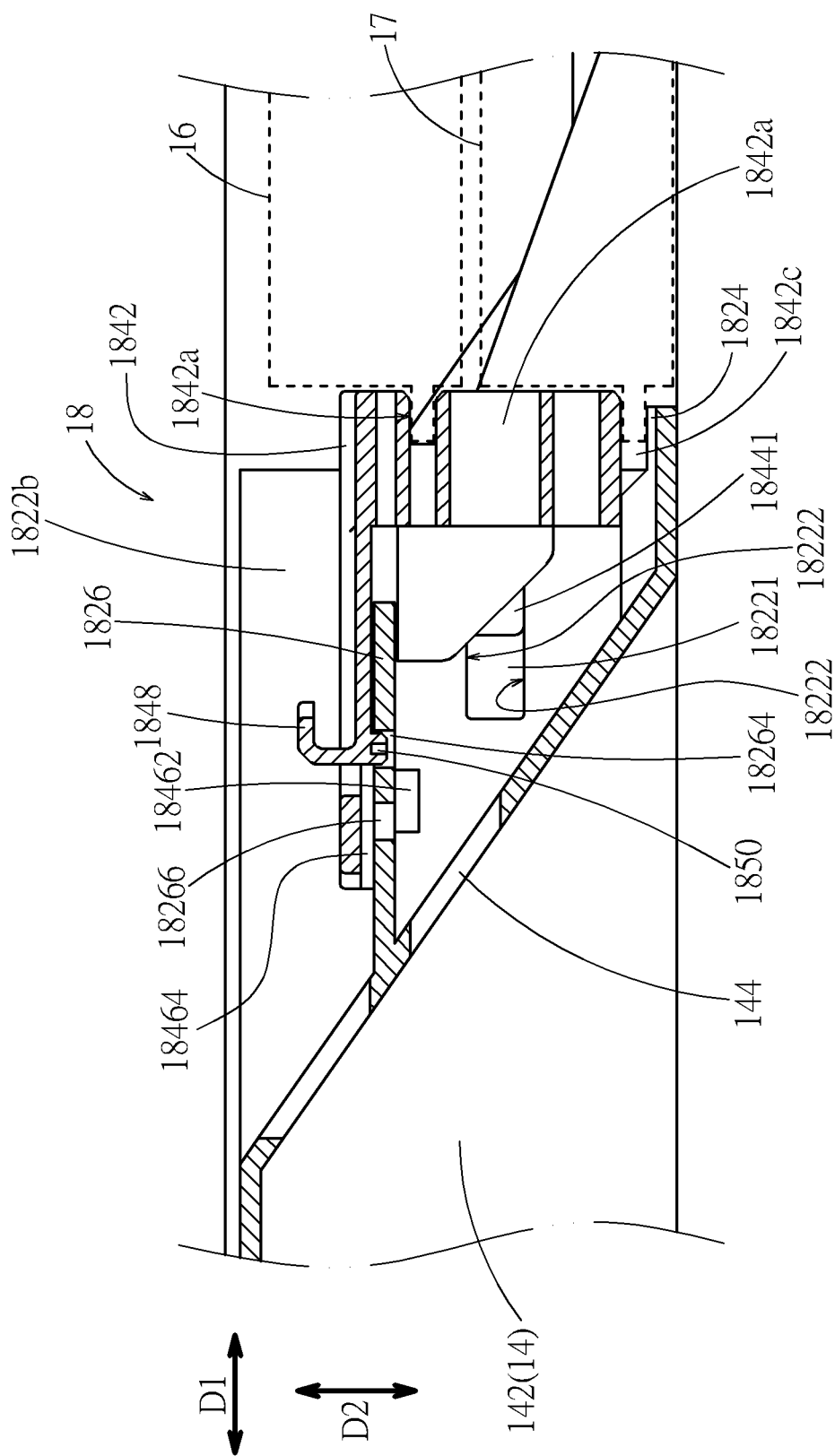
FIG. 5 is a sectional view of the expansion card holding mechanism along the line X-X in FIG. 1.
Figure 6:
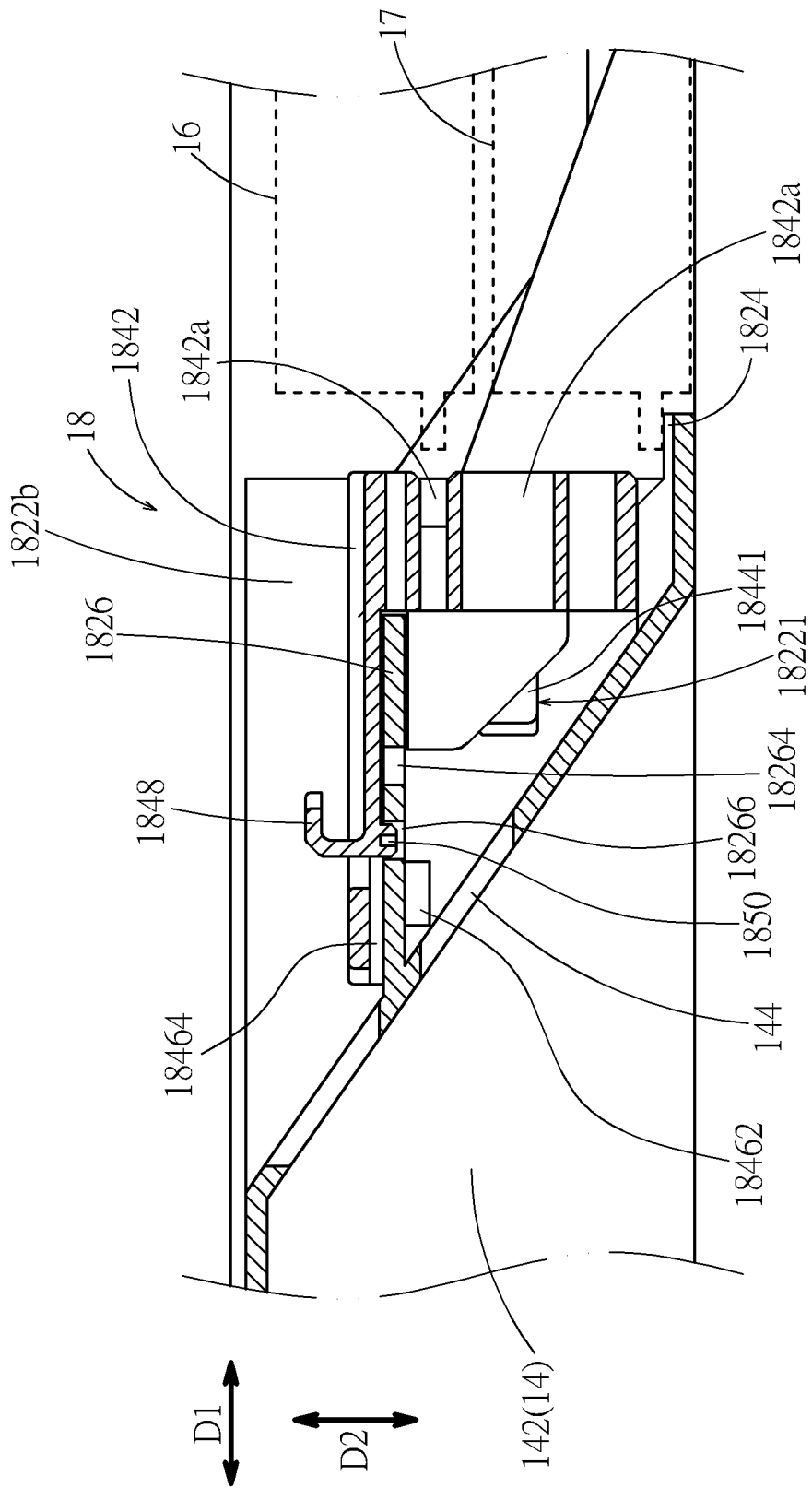
FIG. 6 is a schematic diagram illustrating the expansion card holding mechanism in FIG. 5 when the sliding part is located at a disengaging position.

Please refer to FIG. 2 to FIG. 8. The flow guiding structure 14 has a flow guiding passageway 142 and a plurality of vents 144. The expansion card holding mechanism 18 includes a sliding slot structure 182 and a sliding part 184. The sliding slot structure 182 is disposed on the flow guiding structure 14 and includes two opposite side walls 1822a and 1822b and a supporting portion 1824. The side walls 1822a and 1822b form an accommodating space therebetween for the sliding part 184 to slide therein. The sliding part 184 includes a sliding body 1842 and two positioning portions 1844a and 1844b. The sliding body 1842 is slidably disposed along a direction D1 (indicated by a double-head arrow in the figures) between the two side walls 1822a and 1822b. The two positioning portions 1844a and 1844b protrude from two opposite sides of the sliding body 1842 and are slidably engaged with the two side walls 1822a and 1822b respectively. The sliding body 1842 has a plurality of flow-guiding through holes 1842a and an expansion card holding slot 1842b. The flow-guiding through holes 1842a are disposed close to the expansion card holding slot 1842b and extend parallel to the direction D1. The expansion card holding slot 1842b is used for holding the board body of the expansion card 16 (i.e. a circuit board thereof). The flow-guiding through holes 1842a are aligned with the vents 144 in the direction D1 (as shown by FIG. 5 and FIG. 6), so that the air flow can smoothly flow through the flow-guiding through holes 1842a and the vents 144. In practice, the vents 144 are not limited to be exactly aligned with the flow-guiding through holes 1842a. In principle, it is practicable that the projections of the flow-guiding through holes 1842a and the vents 144 overlap so that the air flow can smoothly flow through the flow-guiding through holes 1842a and the vents 144 to dissipate heat generated by the expansion card 16. Furthermore, in the embodiment, the direction of the air flow guided by the flow guiding structure 14 through the vents 144 is substantially parallel to the direction D1. Furthermore, in the embodiment, the sliding slot structure 182 and the flow guiding structure 14 are formed by structural integration (for example but not limited to injection moulding). However, in practice, the sliding slot structure 182 can be provided additionally and then assembled to the flow guiding structure 14. For example, the sliding slot structure 182 can be a recess structure, a U-shaped structure, or even a plurality of parts, and then fixed to the flow guiding structure 14.

Figure 7:
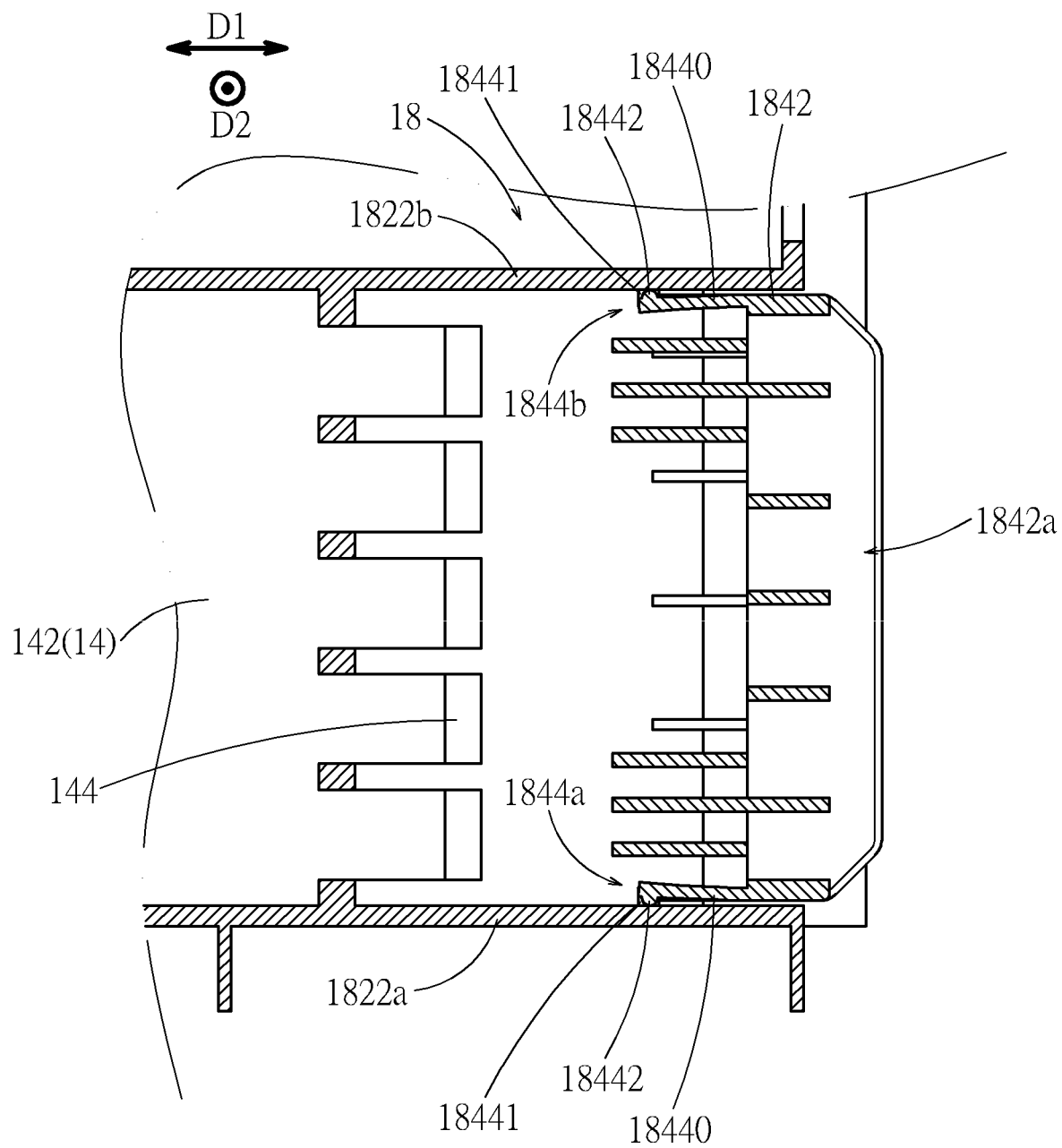
FIG. 7 is a sectional view of the expansion card holding mechanism in FIG. 1, of which the position of the cutting plane is equivalent to the line Y-Y in FIG. 3.

In the embodiment, the two positioning portions 1844a and 1844b are structurally the same and symmetrical. For simplification of description, the following description will be based on the positioning portion 1844a and the corresponding side wall 1822a. It is also applied to the positioning portion 1844b and the corresponding side wall 1822b, which will not be described in addition. Furthermore, in the figures, the structural relationships of the two positioning portions 1844a and 1844b and the corresponding side walls 1822a and 1822b can refer to each other and will not be identified specifically in the following description for simplification of description. The positioning portion 1844a includes an elastic arm 18440 and a sliding hook 18441. The elastic arm 18440 is so elastic as to slidably elastically abuts against a surface of the corresponding side wall 1822a, which is conducive to the sliding body 1842 smoothly sliding between the two side walls 1822a and 1822b and allows a larger fitting tolerance between the sliding body 1842 and the two side walls 1822a and 1822b leading to a reduction of manufacturing cost. In the embodiment, the elastic arm 18440 is provided in a form of a cantilever and extends parallel to the direction D1 from the sliding body 1842. The elastic arm 18440 performs elasticity by the structure property of the cantilever. An end of the cantilever slidably abuts against the surface of the corresponding side wall 1822a. The elastic arm 18440 has two protrusions 18442 at the end of the cantilever and slidably elastically abuts against the surface of the corresponding side wall 1822a through the protrusions 18442 (as shown by FIG. 7), which can reduce the contact area between the elastic arm 18440 and the side walls 1822a. In practice, the elastic arm 18440 can be an elastic piece that is curved. The elastic piece arches toward the corresponding side wall 1822a and elastically abuts against the side walls 1822a; for example, an end of the elastic piece is fixed on the sliding body 1842, and the other end thereof at least can slide on a surface of the sliding body 1842. Furthermore, the elastic piece can form a protruding spot by protruding outward a portion of the elastic piece that touches the side walls 1822a (i.e. protruding toward the side walls 1822a; for example, but not limited to by pressing an elastic metal sheet), for abutting against the side walls 1822a.

Figure 8:
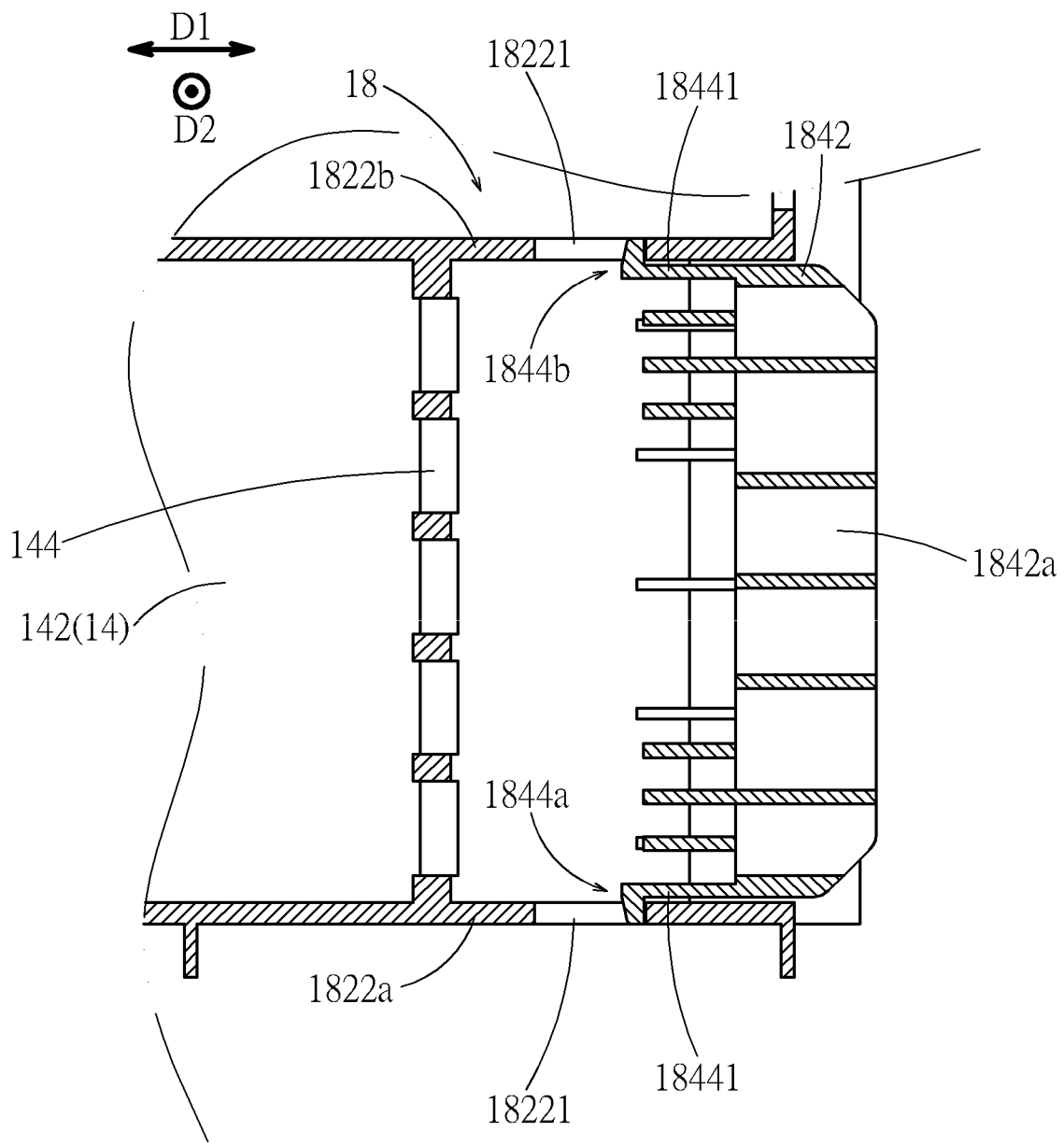
FIG. 8 is a sectional view of the expansion card holding mechanism in FIG. 1, of which the position of the cutting plane is equivalent to the line Z-Z in FIG. 3.
Figure 9:
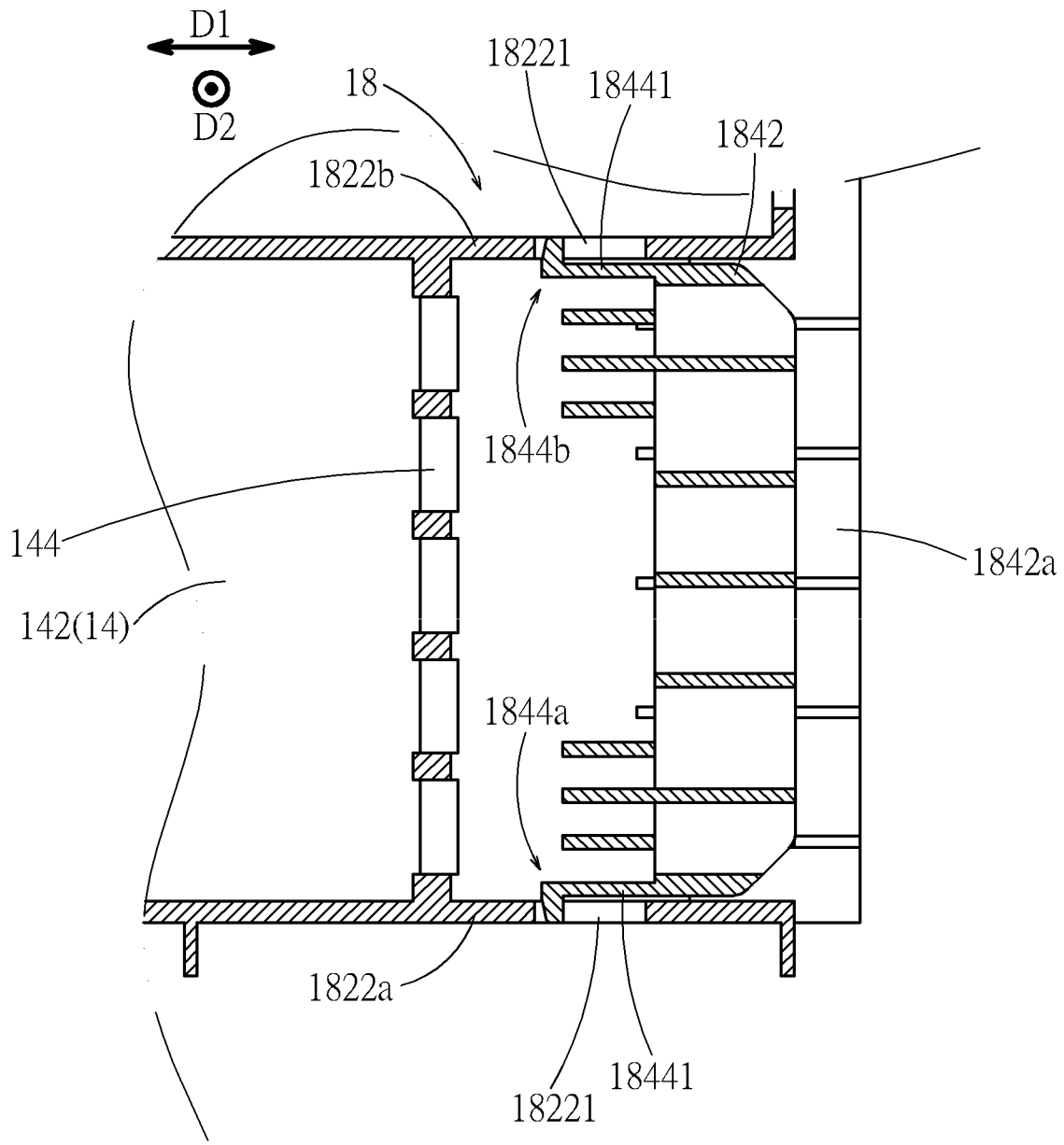
FIG. 9 is a schematic diagram illustrating the expansion card holding mechanism in FIG. 8 when the sliding part is located at the disengaging position.

Furthermore, in the embodiment, the side wall 1822a of the corresponding positioning portion 1844a has a limitation slot 18221 that extends parallel to the direction D1. The sliding hook 18441 is slidably disposed in the limitation slot 18221. When the sliding part 184 is located at a supporting position, the sliding hook 18441 hooks an end of the limitation slot 18221 (as shown by FIG. 8), and the board body of the expansion card 16 (of which the hidden profile is shown in dashed lines in FIG. 5 and FIG. 6) is inserted into the expansion card holding slot 1842b so that the expansion card holding slot 1842b can support the expansion card 16 (as shown by FIG. 1 and FIG. 5). Please also refer to FIG. 9. When the sliding part 184 slides relative to the sliding slot structure 182 to a disengaging position, the sliding hook 18441 slides in the limitation slot 18221 and departs from the end (as shown by FIG. 9), and the expansion card holding slot 1842b departs from the board body of the expansion card 16 (as shown by FIG. 6) so that a user can implement a detachment operation of the expansion card 16. In addition, in the embodiment, when the sliding part 184 is located at the supporting position (as shown by FIG. 5), the supporting portion 1824 of the sliding slot structure 182 and the sliding body 1842 of the sliding part 184 form another expansion card holding slot 1842c that can hold, support the board body of another expansion card 17 (of which the profile is shown in dashed lines in FIG. 5 and FIG. 6). Similarly, when the sliding part 184 is located at the disengaging position, the expansion card holding slot 1842c breaks down or is insufficient to hold, support the board body of the expansion card 17, so that the user can implement a detachment operation of the expansion card 17. Furthermore, as shown by FIG. 5, the flow-guiding through hole 1842a is located between the two expansion card holding slots 1842b and 1842c, so the air flow passing through the flow-guiding through holes 1842a can dissipate heat from the expansion cards 16 and 17 at the same time.

Figure 10:
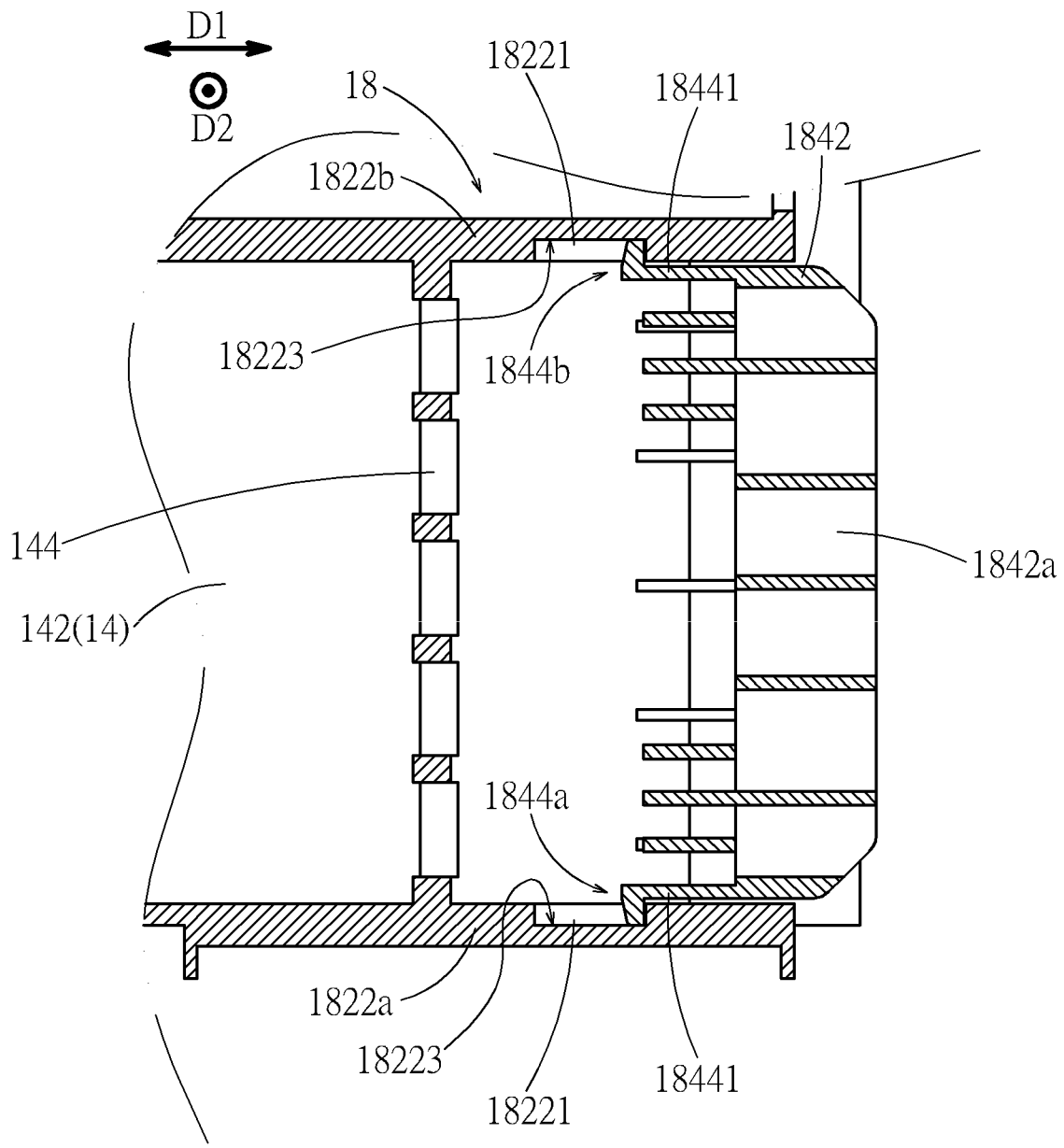
FIG. 10 is a schematic diagram illustrating a cross-section of the sliding hook and the limitation slot according to an embodiment.

Please refer to FIG. 8 and FIG. 9. In the embodiment, the limitation slot 18221 has two opposite sides 18222 parallel to the direction D1. The sliding hook 18441 slidably abuts against the two sides 18222. Thereby, during the sliding of the sliding hook 18441 relative to the limitation slot 18221, the limitation slot 18221 can structurally constrain the sliding hook 18441, which is conducive to the sliding body 1842 smoothly sliding between the two side walls 1822a and 1822b. The limitation slot 18221 provides positioning in a direction D2 (indicated by a double-head arrow in the figures, and perpendicular to direction D1) to the sliding hook 18441. Furthermore, in the embodiment, the sliding hook 18441 surface contacts the two sides 18222, which can enhance the above structural constraining effect. In addition, in the embodiment, the sliding hook 18441 is provided in a form of a cantilever, so the sliding hook 18441 is elastic too. In an embodiment, as shown by FIG. 10, the limitation slot 18221' is a recess structure and has a slot bottom surface 18223. The slot bottom surface 18223 extends parallel to the direction D1. The sliding hook 18441 slidably abuts against the slot bottom surface 18223. In this case, the sliding hook 18441 also has the effect like the elastic arm 18440; in other words, the elastic arm 18440 can be skipped herein.

Please refer to FIG. 2 to FIG. 5. The sliding slot structure 182 includes a supporting plate 1826 that extends parallel to the direction D1 between the two side walls 1822a and 1822b. The sliding part 184 includes an extension portion 1846. The extension portion 1846 extends parallel to the direction D1 from the sliding body 1842 and includes two opposite L-shaped sliding hooks 18462. The L-shaped sliding hook 18462 is slidably engaged with the supporting plate 1826. In the embodiment, the L-shaped sliding hook 18462 is slidably disposed in a sliding slot 18262 of the supporting plate 1826; however, it is not limited thereto in practice. For example, the supporting plate 1826 can be provided in a form of a cantilever board. The L-shaped sliding hook 18462 slidably hooks two side edges of the cantilever board. Furthermore, in the embodiment, the extension portion 1846 has a plurality of protruding ribs 18464 slidably touching the supporting plate 1826, which is conducive to the extension portion 1846 smoothly sliding relative to the supporting plate 1826.

Furthermore, in the embodiment, the sliding part 184 also includes a manipulation portion 1848 fixed connected to the sliding body 1842. The user can slide the sliding part 184 through the manipulation portion 1848. The sliding part 184 also includes a positioned portion 1850; the sliding slot structure 182 also includes two positioning structures 18264 and 18266 correspondingly. The positioned portion 1850 is selectively engaged with one of the positioning structures 18264 and 18266, for positioning the sliding part 184 relative to the sliding slot structure 182. In the embodiment, the positioned portion 1850 is a post, and the positioning structures 18264 and 18266 are holes. As shown by FIG. 5, when the sliding part 184 is located at the supporting position, the positioned portion 1850 fits in the positioning structure 18264. As shown by FIG. 6, when the sliding part 184 is located at the disengaging position, the positioned portion 1850 fits in the positioning structure 18266. Furthermore, in the embodiment, the positioned portion 1850 is disposed on the manipulation portion 1848. The positioning structures 18264 and 18266 are formed on the supporting plate 1826. The manipulation portion 18448 is provided in a form of a cantilever that can provide elastic displacement to the positioned portion 1850 for fitting in the positioning structure 18264 or the positioning structure 18266. However, it is not limited thereto in practice. For example, the positioned portion 1850 can be a protrusion (e.g. a protruding dome) instead, which protrudes outward directly from a side wall surface of the sliding body 1842; the positioning structures 18264 and 18266 can be holes (or recesses) instead, which are correspondingly formed on the side wall 1822a or the side wall 1822b. The protrusion also can selectively fit in the hole (or recess) for positioning the sliding part 184 relative to the sliding slot structure 182.

In addition, in the embodiment, the two positioning portions 1844a and 1844b are structurally the same; however, it is not limited thereto in practice. For example, it is practicable to leave only the positioning portion 1844a (or the positioning portion 1844b) at one side of the sliding part 184, which also can perform the above positioning effect (including the elastic arm 18440 elastically abutting against the side wall 1822a and the limitation slot 18221 structurally constraining the sliding hook 18441) of the positioning portion 1844a (or the positioning portion 1844b). For another example, it is practicable to leave only one of the elastic arm 18440 and the sliding hook 18441 of the positioning portion 1844a, and to leave one of the elastic arm 18440 and the sliding hook 18441 of the positioning portion 1844b. The positioning portions 1844a and 1844b also can perform the above positioning effect. For another example, the positioning portions 1844a and 1844b respectively have different amounts of the elastic arms 18440 and the sliding hooks 18441.

In addition, in the embodiment, another expansion card holding mechanism 19 of the electronic equipment 1 is the same as the expansion card holding mechanism 18 in structural logic. For the action of the expansion card holding mechanism 19 and the structural relationship between the expansion card holding mechanism 19 and the flow guiding structure 14, please refer to the relevant descriptions of the expansion card holding mechanism 18, which will not be described in addition. As shown in FIG. 1, the expansion card holding mechanism 19 is disposed close to the expansion card holding mechanism 18 in a direction perpendicular to the directions D1 and D2, and also is used for holding, supporting an expansion card (not shown in the figure). Thereby, expansion cards can be installed in the electronic equipment 1 in a compact configuration.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An expansion card holding mechanism, disposed on a flow guiding structure in a device casing, the flow guiding structure having a vent, the expansion card holding mechanism comprising:
   a sliding slot structure, disposed in the flow guiding structure, the sliding slot structure comprising two opposite side walls and a supporting plate extending parallel to the direction between the two side walls; and a sliding part, the sliding part comprising a sliding body, a positioning portion, and an extension portion, the sliding body being slidably disposed along a direction between the two side walls, the positioning portion protruding from the sliding body and being slidably engaged with one of the two slide walls, the sliding body having a flow-guiding through hole and an expansion card holding slot, the flow-guiding through hole being aligned with the vent in the direction, the extension portion extending parallel to the direction from the sliding body and comprising an L-shaped sliding hook, the L-shaped sliding hook being slidably engaged with the supporting plate.

2. The expansion card holding mechanism according to claim 1, wherein the sliding part comprises another positioning portion, the two positioning portions protrude from two opposite sides of the sliding body and are slidably engaged with the two side walls respectively.

3. The expansion card holding mechanism according to claim 1, wherein the positioning portion comprises an elastic arm, and the elastic arm slidably elastically abuts against a surface of the corresponding side wall.

4. The expansion card holding mechanism according to claim 3, wherein the elastic arm is provided in a form of a cantilever and extends parallel to the direction from the sliding body, and an end of the cantilever slidably abuts against the surface of the corresponding side wall.

5. The expansion card holding mechanism according to claim 3, wherein the elastic arm has a protrusion, and the elastic arm slidably elastically abuts against the surface of the corresponding side wall through the protrusion.

6. The expansion card holding mechanism according to claim 1, wherein the positioning portion comprises a sliding hook, the corresponding side wall has a limitation slot, the limitation slot extends parallel to the direction, and the sliding hook is slidably disposed in the limitation slot.

7. The expansion card holding mechanism according to claim 6, wherein the limitation slot has two opposite sides extending parallel to the direction, and the sliding hook slidably abuts against the two sides.

8. The expansion card holding mechanism according to claim 6, wherein the limitation slot has a slot bottom surface extending parallel to the direction, the sliding hook is provided in a form of a cantilever, and the sliding hook slidably elastically abuts against the slot bottom surface.

9. The expansion card holding mechanism according to claim 1, wherein the extension portion has a plurality of protruding ribs slidably touching the supporting plate.

10. The expansion card holding mechanism according to claim 1, wherein the flow-guiding through hole is close to the expansion card holding slot.

11. The expansion card holding mechanism according to claim 1, wherein the sliding slot structure has a supporting portion, and the supporting portion and the sliding part form another expansion card holding slot.

12. The expansion card holding mechanism according to claim 11, wherein the flow-guiding through hole is located between the two expansion card holding slots.

13. The expansion card holding mechanism according to claim 1, wherein the sliding part comprises a positioned portion, the sliding slot structure comprises two positioning structures, and the positioned portion is selectively engaged with one of the positioning structures.

* * * * *